(12) United States Patent
Möhrle et al.

(10) Patent No.: US 10,855,051 B2
(45) Date of Patent: Dec. 1, 2020

(54) SEMICONDUCTOR LIGHT SOURCE AND METHOD FOR MANUFACTURING A SEMICONDUCTOR LIGHT SOURCE

(71) Applicant: Fraunhofer-Gesellschaft zur Förderung der angewandten Forschung e.V., Munich (DE)

(72) Inventors: Martin Möhrle, Berlin (DE); Michael Theurer, Berlin (DE); Ariane Sigmund, Berlin (DE); Ute Troppenz, Berlin (DE)

(73) Assignee: Fraunhofer-Gesellschaft zur Förderung der angewandten Forschung e.V. (DE)

( * ) Notice: Subject to any disclaimer, the term of this patent is extended or adjusted under 35 U.S.C. 154(b) by 314 days.

(21) Appl. No.: 15/938,521

(22) Filed: Mar. 28, 2018

(65) Prior Publication Data

US 2018/0219350 A1    Aug. 2, 2018

Related U.S. Application Data

(63) Continuation of application No. PCT/EP2016/072519, filed on Sep. 22, 2016.

(30) Foreign Application Priority Data

Oct. 1, 2015    (DE) .......................... 10 2015 219 056

(51) Int. Cl.
*H01S 5/022* (2006.01)
*H01S 5/028* (2006.01)
(Continued)

(52) U.S. Cl.
CPC .......... *H01S 5/02268* (2013.01); *H01S 5/026* (2013.01); *H01S 5/0224* (2013.01);
(Continued)

(58) Field of Classification Search
CPC .... H01S 5/0224; H01S 5/02256; H01S 5/026; H01S 5/22; H01S 5/34306; H01S 5/4025; H01S 5/4031; H01S 5/50
See application file for complete search history.

(56) References Cited

U.S. PATENT DOCUMENTS

| | | | |
|---|---|---|---|
| 7,415,180 B2 | 8/2008 | Blidegn | |
| 2002/0001326 A1* | 1/2002 | Chino | G02B 6/423 372/45.01 |

(Continued)

FOREIGN PATENT DOCUMENTS

| | | |
|---|---|---|
| DE | 19611907 A1 | 10/1997 |
| EP | 0798576 A2 | 10/1997 |
| JP | 2000124539 A | 4/2000 |

OTHER PUBLICATIONS

L.Schares et al: Etched-Facet Semiconductor Optical Amplifiers for Gain-Integrated Photonic Switch Fabrics_ECOC 2015_ID0727 (3 pages).

(Continued)

*Primary Examiner* — Eric L Bolda
(74) *Attorney, Agent, or Firm* — Haynes and Boone, LLP

(57) ABSTRACT

What is shown is a method for manufacturing a semiconductor light source. The semiconductor light source has a substrate and a layer sequence arranged above the substrate, the same having a light-emitting layer and an upper boundary layer arranged above the light-emitting layer. The layer sequence is patterned in order to form a light-emitting stripe for defining the semiconductor light source and an alignment stripe, extending in parallel thereto, as a horizontal alignment mark at the same time. Then, a cover layer is applied on the patterned layer sequence and a part of the cover layer is removed in order to expose the alignment stripe and expose a region of the layer sequence outside the light-emitting stripe and spaced apart from a light-entrance edge (Continued)

or a light-exit edge of the light-emitting stripe as a vertical alignment mark.

19 Claims, 13 Drawing Sheets

(51) Int. Cl.

| | | |
|---|---|---|
| H01S 5/40 | (2006.01) | |
| H01S 5/50 | (2006.01) | |
| H01S 5/026 | (2006.01) | |
| H01S 5/22 | (2006.01) | |
| H01S 5/343 | (2006.01) | |
| H01S 5/14 | (2006.01) | |
| G02B 6/42 | (2006.01) | |
| H01S 5/12 | (2006.01) | |
| H01S 5/125 | (2006.01) | |

(52) U.S. Cl.
CPC ........ *H01S 5/0281* (2013.01); *H01S 5/02256* (2013.01); *H01S 5/22* (2013.01); *H01S 5/34306* (2013.01); *H01S 5/4025* (2013.01); *H01S 5/4031* (2013.01); *H01S 5/50* (2013.01); *G02B 6/4224* (2013.01); *H01S 5/12* (2013.01); *H01S 5/125* (2013.01); *H01S 5/14* (2013.01); *H01S 5/40* (2013.01)

(56) References Cited

U.S. PATENT DOCUMENTS

| | | | |
|---|---|---|---|
| 2002/0006151 A1 | 1/2002 | Yamauchi | |
| 2002/0119588 A1* | 8/2002 | Bowen | B82Y 20/00 |
| | | | 438/47 |
| 2006/0093002 A1 | 5/2006 | Park et al. | |
| 2008/0304802 A1 | 12/2008 | Watanabe et al. | |
| 2009/0130830 A1 | 5/2009 | Narita | |
| 2009/0245322 A1* | 10/2009 | Hudgings | G01M 11/30 |
| | | | 374/45 |
| 2013/0023077 A1* | 1/2013 | Hiratsuka | H01S 5/0202 |
| | | | 438/31 |
| 2015/0124846 A1* | 5/2015 | Behfar | H01S 5/0071 |
| | | | 372/44.01 |

OTHER PUBLICATIONS

T. Mitze et al., "Hybrid integration of III/V lasers on a silicon-on-insulator (SOI) optical board," in 2nd IEEE International Conference on Group IV Photonics, 2005, 2005, pp. 210-212. (3 pages).

T. Mitze et al., "CWDM Transmitter Module Based on Hybrid Integration," IEEE Journal of Selected Topics in Quantum Electronics, vol. 12, No. 5, pp. 983-987, Sep. 2006. (5 pages).

L. Stampoulidis et al., "The BOOM project: a new generation of photonic routing subsystems using hybrid integration on silicon-on-insulator waveguide boards," 2010, vol. 7719, pp. 771909-771909-8. (10 pages).

J. Kreissl et al. "1550 nm flip-chip compatible electroabsorption-modulated laser with 40 Gb/s modulation capability," in Compound Semiconductor Week (CSW/IPRM), 2011 and 23rd International Conference on Indium Phosphide and Related Materials, 2011, pp. 1-4. (4 pages).

L. Zimmermann et al., "Packaging and Assembly for Integrated Photonics #x2014;A Review of the ePIXpack Photonics Packaging Platform," IEEE Journal of Selected Topics in Quantum Electronics, vol. 17, No. 3, pp. 645-651, May 2011. (7 pages).

L. Zimmermann et al., "High-precision flip-chip technology for alloptical wavelength conversion using SOI photonic circuit," in 2011 8th IEEE International Conference on Group IV Photonics (GFP), 2011, pp. 237-239. (3 pages).

C. Stamatiadis et al., "A hybrid photonic integrated wavelength converter on a silicon-on-insulator substrate," in Optical Fiber Communication Conference and Exposition (OFC/NFOEC), 2012 and the National Fiber Optic Engineers Conference, 2012, pp. 1-3. (3 pages).

* cited by examiner

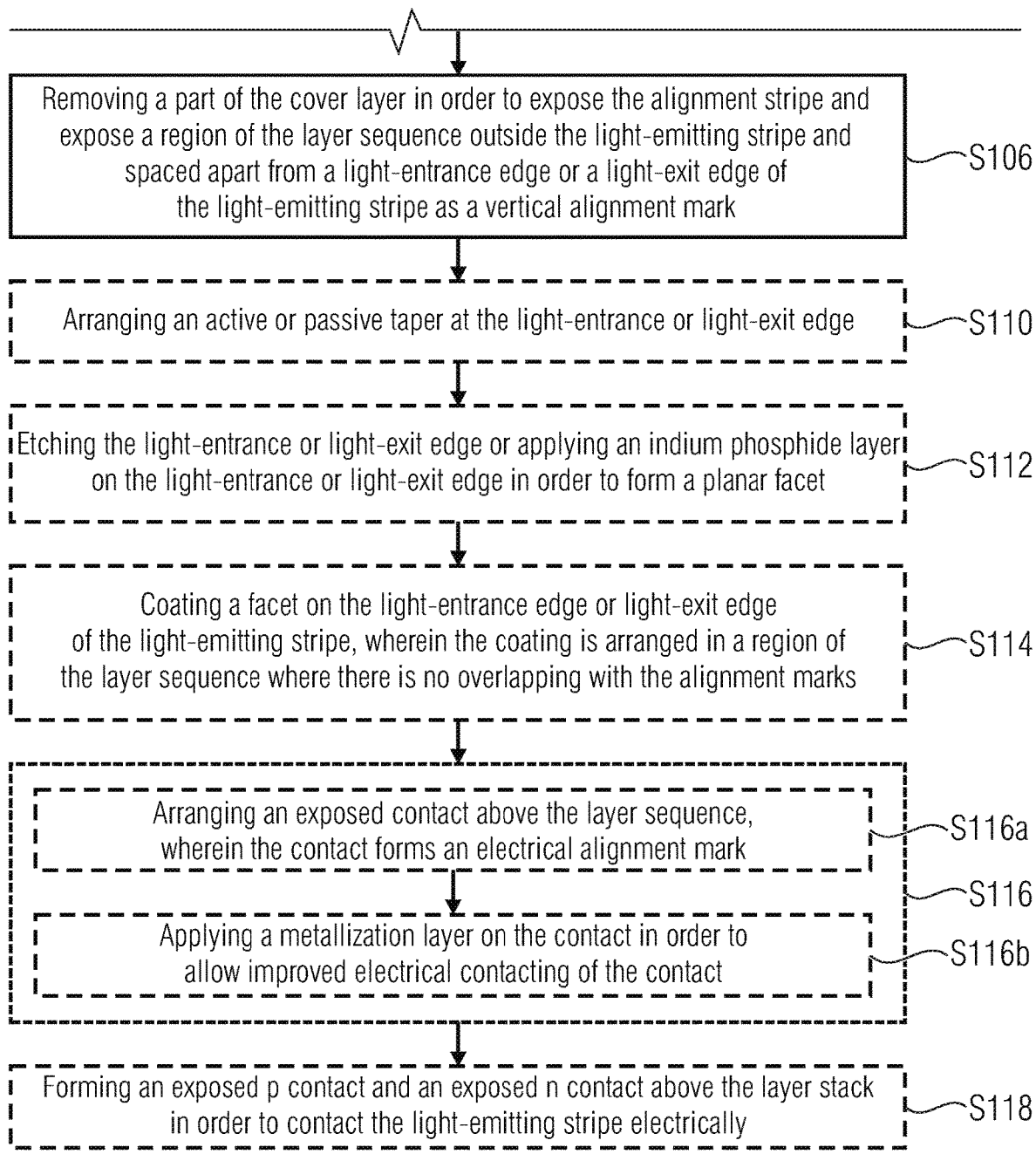
Fig. 3B
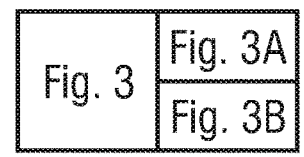

SEMICONDUCTOR LIGHT SOURCE AND METHOD FOR MANUFACTURING A SEMICONDUCTOR LIGHT SOURCE

CROSS-REFERENCE TO RELATED APPLICATIONS

This application is a continuation of co-pending International Application No. PCT/EP2016/072519, filed Sep. 22, 2016, which is incorporated herein by reference in its entirety, and additionally claims priority from German Application No. 10 2015 219 056.0, filed Oct. 1, 2015, which is also incorporated herein by reference in its entirety.

BACKGROUND OF THE INVENTION

The present invention relates to a method for manufacturing a semiconductor light source, and to a semiconductor light source which can be manufactured using the method described. Embodiments show BH (buried heterostructure) laser arrays and SOA (semiconductor optical amplifier) arrays having novel vertical support areas, monitor contacts and horizontal alignment marks for precise XYZ alignment in flip-chip mounting.

Over the last few years, silicon photonics has left the research stage and become established on the market. The advantages of silicon technology are that optical and electronic functions can be integrated monolithically in a mass process in a compact, energy-efficient and cheap manner. However, this integration platform is still lacking a light source.

So far, InP-based laser or semiconductor amplifiers (SOAs) have mainly been used as single chips or in an array assembly which can be coupled to Si waveguides in flip-chip mounting using so-called butt-joint coupling. Alternatively, vertically emitting lasers (VCSEL: vertical cavity surface emitting laser, HCSEL: horizontal cavity surface emitting laser) which are coupled into Si waveguides using Si grating couplers may also be used.

In both cases, precise XYZ alignment of the laser components in the sub-μm range is employed in order to ensure efficient light coupling.

Many tests have been performed over the last few years. In the well-known cases [1] . . . [7], support areas on the laser components were defined by means of dry-etching technology, which then function as contact areas in flip-chip mounting. However, the precision of vertical Z alignment is directly dependent on the precision of the etching depth to be realized by means of dry etching. Usually, butt-coupling is used in the laser direction (X), horizontal stops are used in a direction perpendicular to the laser direction, or alignment takes place using alignment marks especially applied to the laser components [1] . . . [7].

However, the procedures known so far exhibit some considerable disadvantages:

vertical contact areas manufactured by means of dry etching are not sufficiently precise horizontal/lateral stops cannot be used with oblique laser stripes (like SOA), due to the limited gap precision of the lasers the position precision of alignment marks realized on laser components is directly dependent on the lithography precision and is not sufficient for precise alignment.

SUMMARY

According to an embodiment, a method for manufacturing a semiconductor light source having a substrate, a layer sequence arranged above the substrate having a light-emitting layer and an upper boundary layer arranged above the light-emitting layer, a horizontal alignment mark and vertical contact areas, may have the steps of: patterning the layer sequence in order to form a light-emitting stripe for defining the semiconductor light source and an alignment stripe extending in parallel thereto at the same time; applying a cover layer on the patterned layer sequence; removing a first part of the cover layer in order to expose the alignment stripe as the horizontal alignment mark, and second parts of the cover layer in order to expose, on both sides of the light-emitting stripe, regions of the layer sequence spaced apart from a light-entrance edge or a light-exit edge of the semiconductor light source, as vertical contact areas at the same time.

According to another embodiment, a semiconductor light source may have: a substrate, a patterned layer sequence arranged above the substrate having a light-emitting layer and an upper boundary layer arranged above the light-emitting layer, a horizontal alignment mark and vertical contact areas, wherein the patterned layer sequence has a light-emitting stripe which defines the semiconductor light source, and an alignment stripe extending in parallel thereto; a cover layer on the patterned layer sequence; wherein the cover layer is open over a first part of the patterned layer sequence so that the alignment stripe as a horizontal alignment mark is exposed, and wherein the cover layer is open over second parts of the patterned layer sequence so that, on both sides of the light-emitting stripe, regions of the layer sequence arranged to be spaced apart from a light-entrance edge or a light-exit edge of the semiconductor light source, are exposed as vertical contact areas.

Another embodiment may have a cascade of semiconductor light sources having a plurality of inventive semiconductor light sources, wherein the light-exit edge of a semiconductor light source is coupled to the light-entrance edge of a subsequent semiconductor light source.

Another embodiment may have a semiconductor device having: an inventive semiconductor light source or an inventive cascade of semiconductor light sources, a substrate, and an optical unit, the substrate having a recess configured to receive the semiconductor light source or the cascade of semiconductor light sources such that the semiconductor light source is aligned with the optical unit.

Embodiments reveal a method for manufacturing a semiconductor light source comprising a substrate, a layer sequence arranged above the substrate comprising a light-emitting layer and an upper boundary layer arranged above the light-emitting layer, comprising:

patterning the layer sequence in order to form a light-emitting stripe for defining the semiconductor light source and an alignment stripe, extending in parallel thereto, as a horizontal alignment mark at the same time;

depositing a cover layer on the patterned layer sequence; and removing a part of the cover layer in order to expose the alignment stripe and expose a region of the layer sequence outside the light-emitting stripes and spaced apart from a light-entrance edge or a light-exit edge of the light-emitting stripe as a vertical alignment mark.

The present invention is based on the idea of providing alignment marks on or in semiconductor light sources allowing highly precise XYZ alignment of the semiconductor light source in or using a device for receiving the semiconductor light source, like a substrate of a semiconductor chip, comprising the counterparts to the alignment marks in the semiconductor light source. In this way, the semiconductor light source may comprise an indentation or pocket, similar to a groove, whereas the device for receiving the semiconductor light source comprises the respective recess or notch similar to a tongue fitting the groove. The tongue-and-groove association, however, only is of an exemplary nature and may be replaced by other arrangements. For vertical alignment or alignment in the Z direction, the semiconductor light source, like a laser or an optical amplifier (SOA), may comprise one or several recesses in the cover layer which end on the boundary layer, like a (light) waveguide, wherein the waveguide may be inactive in this region of the semiconductor light source. In other words, the vertical alignment marks may be located outside, i.e. not above, the light-emitting stripes. Removing the regions mentioned may take place selectively so that the boundary layer can be etched down to in a highly precise manner. The results is a support area or vertical alignment mark defined precisely (in its height), which is not dependent on imprecisions in (dry) etching methods.

In addition, horizontal alignment marks can be formed or etched in the layer sequence in the same operating step or method step as are the laser structures or the light-emitting stripes. Since the horizontal alignment marks and the laser structures are produced in parallel or at the same time, tiny imprecisions when producing the laser structures are also transferred to the alignment marks, wherein alignment of the semiconductor light source may take place without the manufacturing tolerances mentioned.

In addition, it is of advantage to arrange the vertical alignment marks, i.e. the support areas on the light waveguide, away from the light-entrance and light-exit edges of the semiconductor light source. In this way, it can be ensured that coating the facets on the light-entrance and light-exit edges does not have an effect on the vertical alignment mark, while the coating material for facet coating is not deposited on or at the vertical alignment mark. This allows precise positioning with no offset in the height of the layer thickness which will form inevitably in the case of depositing coating material on the alignment mark.

In accordance with further embodiments, the method comprises arranging at least one exposed contact above the layer sequence, wherein the contact forms an electrical alignment mark. For electrical contacting, it is of advantage to arrange a further contact on the semiconductor light source, which allows a current to flow from the device which receives the semiconductor light source through the semiconductor light source. An alternative embodiment shows a method step for forming the electrical alignment mark comprising arranging at least two exposed contacts, wherein one (or several ones) of the at least two exposed contacts is/are arranged above the layer sequence. A purely electrical and, consequently, easily automatable inspection as to whether the semiconductor light source is arranged at the intended position within the semiconductor device may be performed by means of the electrical contacts. Thus, a semiconductor laser or an optical amplifier, for example, may be inserted in a silicon chip or, generally, a semiconductor chip, wherein the semiconductor chip also comprises contacts as counterparts to the contacts of the semiconductor light source and may exemplarily check by means of a known voltage applied and the current intensity resulting from this whether the contacts in the semiconductor light source contact the contacts in the chip. If the semiconductor light source is arranged in the chip in a misaligned or slanted manner, for example, no or at least only loose or poor contacting takes place with an increased transition or contact resistance of the opposed contacts, the result of this being a reduced current flow with a known voltage applied (or vice versa). In order to allow a defined contact area or improved contacting of the opposed contacts of the chip and the semiconductor light source, for example, a metallization layer may be applied (like vapor-deposited) on the contacts. The contacts can be applied on the cover layer at such a small height that precise positioning of the semiconductor light source is not impaired by the contacts.

Additionally, three-dimensional information acquisition becomes possible by forming the lateral alignment marks which, in accordance with embodiments, are also visible in the facet view, i.e. a top view on the light-entrance and light-exit edges. This is of advantage since (camera-based) handling systems which exemplarily insert the semiconductor light source in the chip, are able to recognize an orientation of the semiconductor light source from any position, without turning the semiconductor light source to a certain position relative to the camera.

BRIEF DESCRIPTION OF THE DRAWINGS

Embodiments of the present invention will be detailed subsequently referring to the appended drawings, in which:

FIG. 10A shows a schematic top view of an SOA array as a semiconductor light source having vertical contact areas and InP facets (with no active layer in the facet region) in accordance with an embodiment, wherein FIG. 10A shows the arrangement of the InP facets over the entire width of the light-exit and light-entrance edges, and FIG. 10B provides for the arrangement of the InP facets in a region of the light-emitting stripes;

FIG. 10B shows a schematic top view of an SOA array as a semiconductor light source having vertical contact areas and InP facets (with no active layer in the facet region) in accordance with an embodiment, wherein FIG. 10A shows the arrangement of the InP facets over the entire width of the light-exit and light-entrance edges, and FIG. 10B provides for the arrangement of the InP facets in a region of the light-emitting stripes;

DETAILED DESCRIPTION OF THE INVENTION

Figure 1:
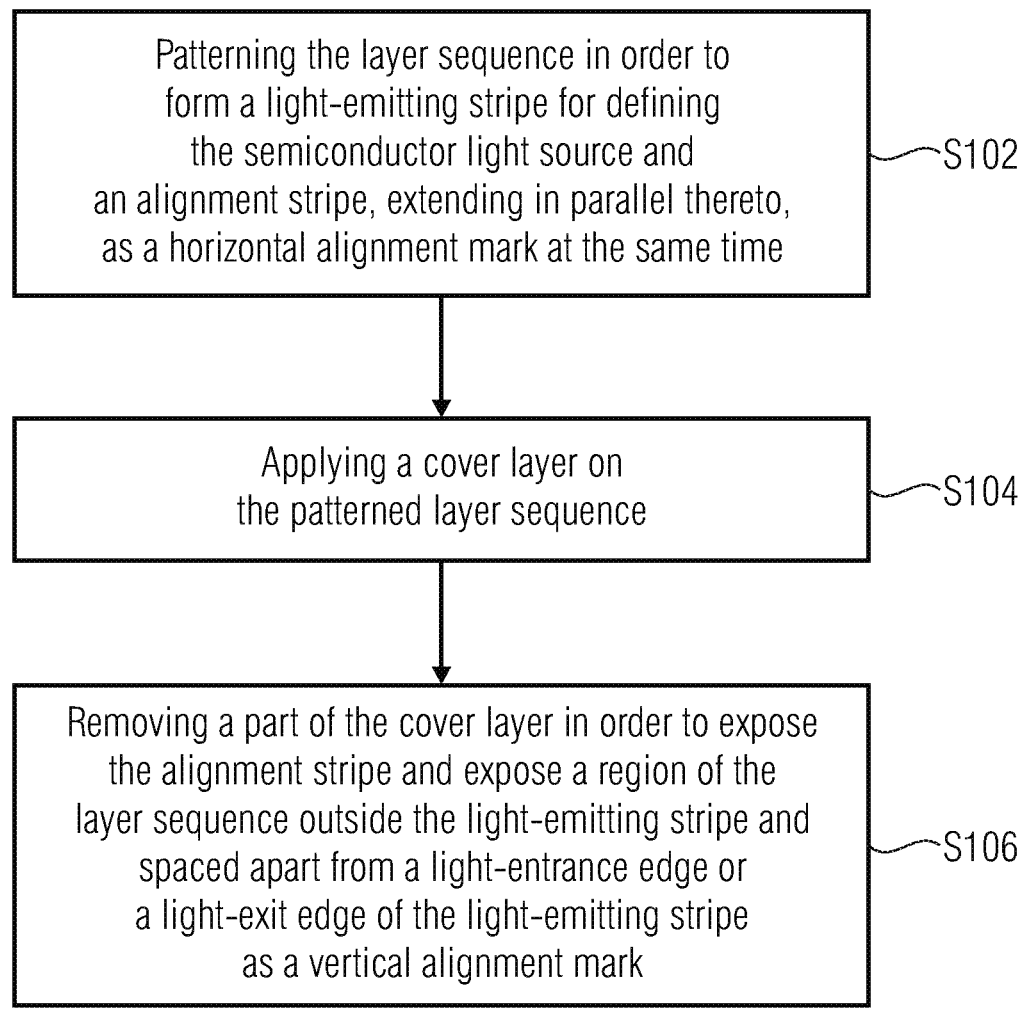
FIG. 1 shows a flowchart of a method for manufacturing a semiconductor light source.

In the following description of the figures, equal elements or elements of equal effect will be provided with equal reference numerals so that the description thereof in the different embodiments is mutually exchangeable.

A method for manufacturing a semiconductor light source and a semiconductor light source manufacturable using the method, comprising vertical contact areas and horizontal alignment marks which both allow precise alignment of the lasers or SOA components irrespective of processing tolerances, gap imprecision and facet coating are shown below. This has not been possible using contact areas/alignment marks known so far.

FIG. 1 shows a schematic illustration of a method 100 for manufacturing a semiconductor light source. The semiconductor light source comprises a substrate and a layer sequence arranged above the substrate, wherein the same comprises a light-emitting layer and an upper boundary layer arranged above the light-emitting layer. In step S102, the layer sequence is patterned in order to form a light-emitting stripe for defining the semiconductor light source and an alignment stripe, extending in parallel thereto, as a horizontal alignment mark at the same time. In another step S104, a cover layer is applied on the patterned layer sequence and, in step S106, a part of the cover layer is removed in order to expose the alignment stripe and to expose a region of the layer sequence outside the light-emitting stripes and spaced apart from a light-entrance edge or a light-exit edge of the light-emitting stripe as a vertical alignment mark.

Patterning the layer sequence and the light-emitting stripes at the same time is of advantage in that the horizontal alignment marks are etched, or formed, in the layer sequence at the same precision or imprecision so that a position of the light-exit regions of the semiconductor light source remains the same relative to the horizontal alignment mark and, consequently, is defined precisely. In horizontal or X-Y alignment, this allows precise positioning of the light-exit regions or light-exit facet on an optical unit, like an (optical or light) waveguide, in a device for receiving the semiconductor light source, like a semiconductor substrate or semiconductor chip. The layer sequence may comprise a light-emitting layer and a (light) waveguide for bundling photons leaving the light-emitting layer.

This means that the structures for light generation and the horizontal alignment marks have been etched in the active or light-emitting layer (or layers) and in the boundary layer arranged above it or, generally, in the layer sequence. The cover layer is then applied above it, which exemplarily comprises a cladding layer and prevents light from exiting the light waveguide at a different position than the light-entrance or light-exit edge or the facets. In the illustrations shown in accordance with embodiments, the cladding layer is p-doped and may also comprise a contact layer at a surface region. The contact layer and the n-InP substrate are then metallized. An optical mode is guided in the waveguide layers optionally present in the light-emitting layer and the cover layer. However, part of the mode may also be positioned in the surrounding layers.

In another step, the horizontal alignment marks just formed and further vertical alignment marks are exposed, for example by means of a wet-etching process. The regions to be etched can be defined precisely by means of masks on the cover layer. In addition, the wet-etching process allows selectively etching the cover layer, wherein the cover layer can be etched selectively down to the boundary layer. The fact that the vertical alignment marks or vertical contact areas are arranged to be spaced apart from the light-entrance and light-exit edges allows coating the light-entrance and light-exit edges or facets afterwards, with no coating material depositing on the vertical contact areas just exposed. Consequently, the precision of aligning the semiconductor light source is not impaired by depositing the coating.

Figure 2:
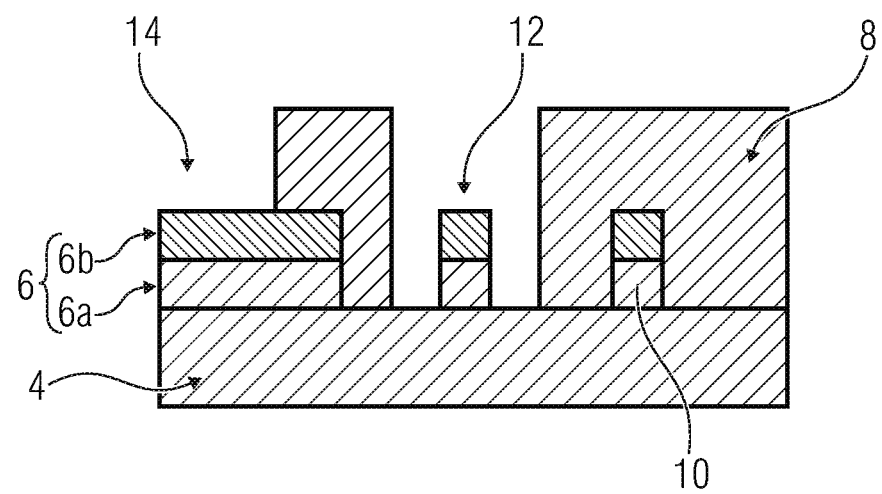
FIG. 2 is a schematic illustration of a semiconductor light source manufactured using the method of FIG. 1.

FIG. 2 shows a schematic illustration of a semiconductor light source which can be manufactured by the method of FIG. 1. The semiconductor light source 2 comprises a substrate 4, a patterned layer sequence 6 arranged above the substrate, and a cover layer 8. The patterned layer sequence 6 comprises a light-emitting layer 6a and a boundary layer 6b arranged above the light-emitting layer 6a. The light-emitting layer exemplarily comprises multiple quantum wells, wherein the light-emitting layer is arranged to be adjacent or next to the waveguide layer 6b. The waveguide layer may be p-doped or n-doped. The patterned layer sequence comprises a light-emitting stripe 10 for defining the semiconductor light source and an alignment stripe 12 extending in parallel thereto. The alignment stripe may be realized by means of a simple recess in the layer sequence (like a groove) or by means of two parallel trenches in the layer sequence (like a tongue).

In addition, the cover layer 8 is arranged on the patterned layer sequence, which is opened in a part of the patterned layer sequence 6 in order to expose the alignment stripe 12 and a region of the layer sequence outside the light-emitting stripes 10. In a profile of the cover layer, a trench or hole can be seen where the cover layer has been opened. The open part of the cover layer which exposes the vertical alignment mark 14, is arranged to be spaced apart from a light-entrance edge or a light-exit edge located at one or both head or front faces of the light-emitting stripe. However, this is not illustrated in the cross-section of the semiconductor light source shown, but will be shown in the top view of FIG. 5 or FIG. 6, for example. In accordance with embodiments, the region above the vertical alignment mark 14 is removed selectively relative to the boundary layer so that the result will be a defined vertical contact area or alignment mark, irrespective of imprecision in the removal process, like an etching process, on the surface of the boundary layer. The cladding layer may comprise smaller a refractive index than the light-emitting layer.

Figure 3A:
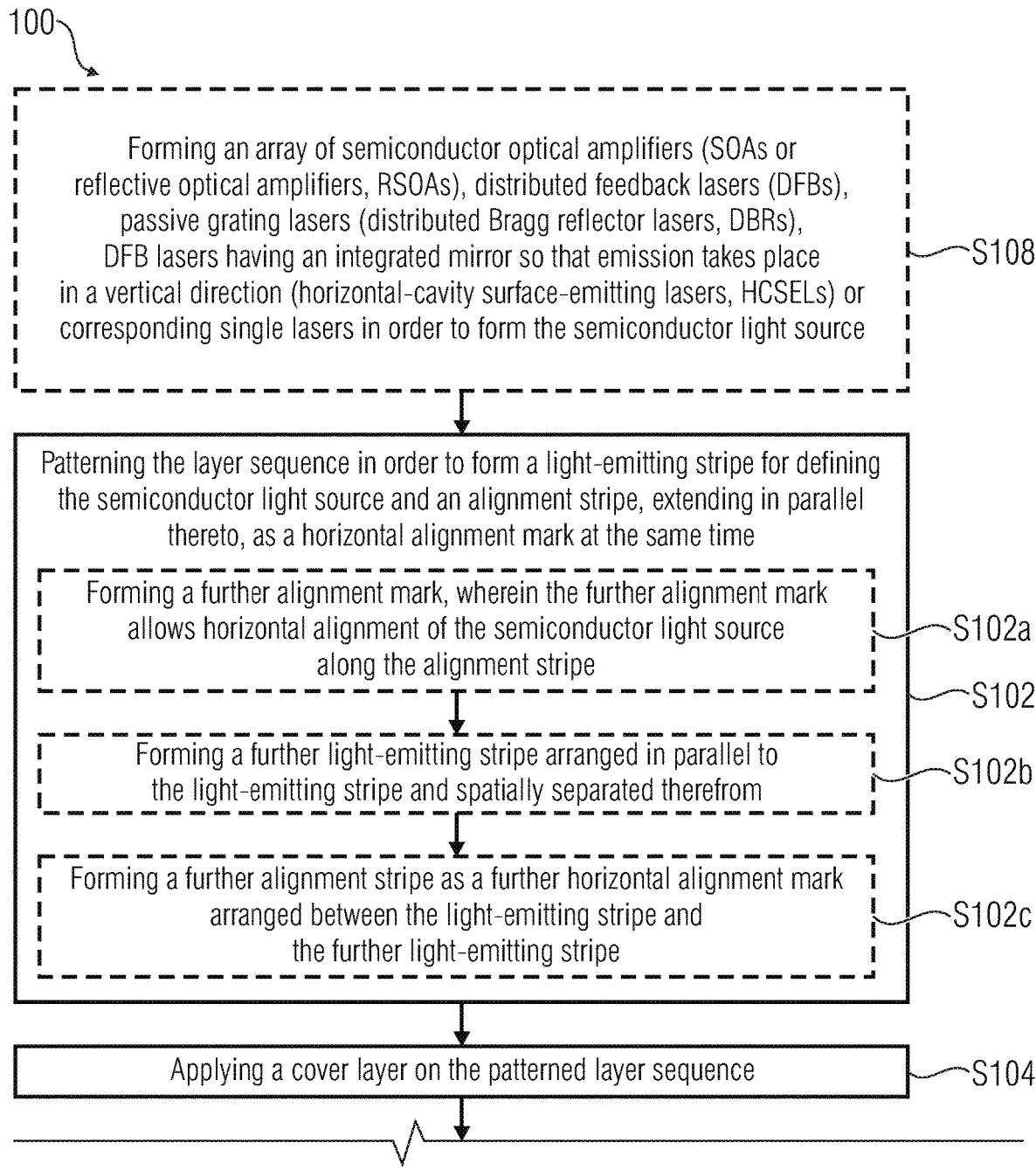
FIG. 3, consisting of FIGS. 3A and 3B, shows a flowchart of the method for manufacturing a semiconductor light source in accordance with an embodiment.

FIG. 3 shows a flowchart of the method 100 comprising further, optional steps for manufacturing the semiconductor light source. It is to be mentioned here that, like in FIG. 1 and generally, the description of the method steps, an order of steps or flow of the method is not limited to the order illustrated and described in FIG. 1 or FIG. 3. Rather, these figures show a possible embodiment, wherein further embodiments may, for example, differ in the usage of the optional steps and in applying the order of steps. Every technically realizable order of steps can be considered to be a possible embodiment.

In addition to FIG. 1, FIG. 3 shows a step S108 where an array of optical semiconductor amplifiers (SOAs or reflective optical amplifiers, RSOAs), distributed feedback lasers (DFBs), passive grating lasers (distributed Bragg reflector lasers, DBRs), DFB lasers having an integrated mirror so that emission will be in a vertical direction (horizontal-cavity surface-emitting lasers, HCSELs) or corresponding single lasers are formed to form the semiconductor light source. However, the list is not to be considered to be exclusive and additionally only is to show typical embodiments of the semiconductor light source. In addition, step S108 can be considered to be an instruction of action for a person skilled in the art to generate any semiconductor light source which comprises the semiconductor light sources mentioned above and additionally any other possible semiconductor light source, and integrate the method steps specific for the method 100 into the known method.

Thus, step S102 comprises patterning the layer sequence. Patterning S102 the light-emitting stripe 10 may form the alignment stripes 12 in an angle 32 greater or smaller than 90° relative to the light-entrance or light-exit edge 22, 24. In accordance with embodiments, step S102 optionally comprises sub-steps S102a, S102b or S102c. In step S102a, a further alignment mark may be formed, wherein the further alignment mark allows horizontal alignment of the semiconductor light source along the alignment stripe. One possible implementation of these further alignment marks will be described in greater detail referring to FIGS. 9 and 10. Irrespective of step S102a, step S102b can be executed by forming a further light-emitting stripe which is arranged in parallel to the light-emitting stripe and is spatially separated from it. Thus, an array structure may be formed which exemplarily comprises the three light-emitting stripes shown in the following figures, like single lasers, optical semiconductor amplifiers or light-emitting diodes (LEDs). When the semiconductor light source is formed in the array structure, i.e. the method 100 is performed including the optional step S102b, a further alignment mark can be formed as a further horizontal alignment mark between the light-emitting stripe and the further light-emitting stripe in step 102c. Further alignment stripes between the array structures may increase the precision of positioning the semiconductor light source in the semiconductor device. In analogy, step S106 may also be adapted by arranging a further vertical alignment mark between the array structures or between the alignment stripe and the further alignment stripe. This may, for example, prevent bending of the semiconductor light source in its center so that the semiconductor light source is not only positioned precisely in a vertical direction in an outer region of the semiconductor light source, but exhibits precise positioning continuously over the entire area.

In addition, the method 100 may comprise step S110 of arranging an active or passive taper at the light-entrance or light-exit edge. The active or passive taper may perform light scattering or light shaping of the light exiting at the light-exit edge, so that light waveguides of different diameters, for example, can be connected to one another by means of the taper. In addition, in step S112, the light-entrance or light-exit edge can be etched or a planar facet be formed by applying an indium phosphide layer on the light-entrance or light-exit edge. The facets are important in particular in lasers and in optical amplifiers in order to emit only light of a certain resonant wavelength with lasers, for example, and minimize reflection at the facets with optical amplifiers (SOAs), in order to avoid feedback effects. Thus, in step S114, the facet at the light-entrance edge or the light-exit edge of the light-emitting stripe can be coated, wherein the coating is arranged in a region of the layer sequence where there is no overlapping with the alignment marks. In other words, coating may influence the vertical alignment of the semiconductor light source in the semiconductor device by also applying the coating on the contact areas for the vertical alignment and, wherein no precise positioning will be possible in this case.

In accordance with further embodiments, the method 100 may comprise step S11 which in turn may comprise steps S116a and S116b. In step S116a, an exposed contact can be arranged above the layer sequence, wherein the contact forms an electrical alignment mark. In order to provide a defined contact area and/or allow improved electrical contacting of the contact, for example, in step S116b, a metallization layer may be applied on the contact. In accordance with further embodiments, in step S118, an exposed p and/or an exposed n contact may be formed above the layer stack in order to electrically contact the light-emitting stripe. This is of advantage since the semiconductor device may provide for complete electrical contacting of the semiconductor light source without the same using an external voltage supply.

Figure 4:
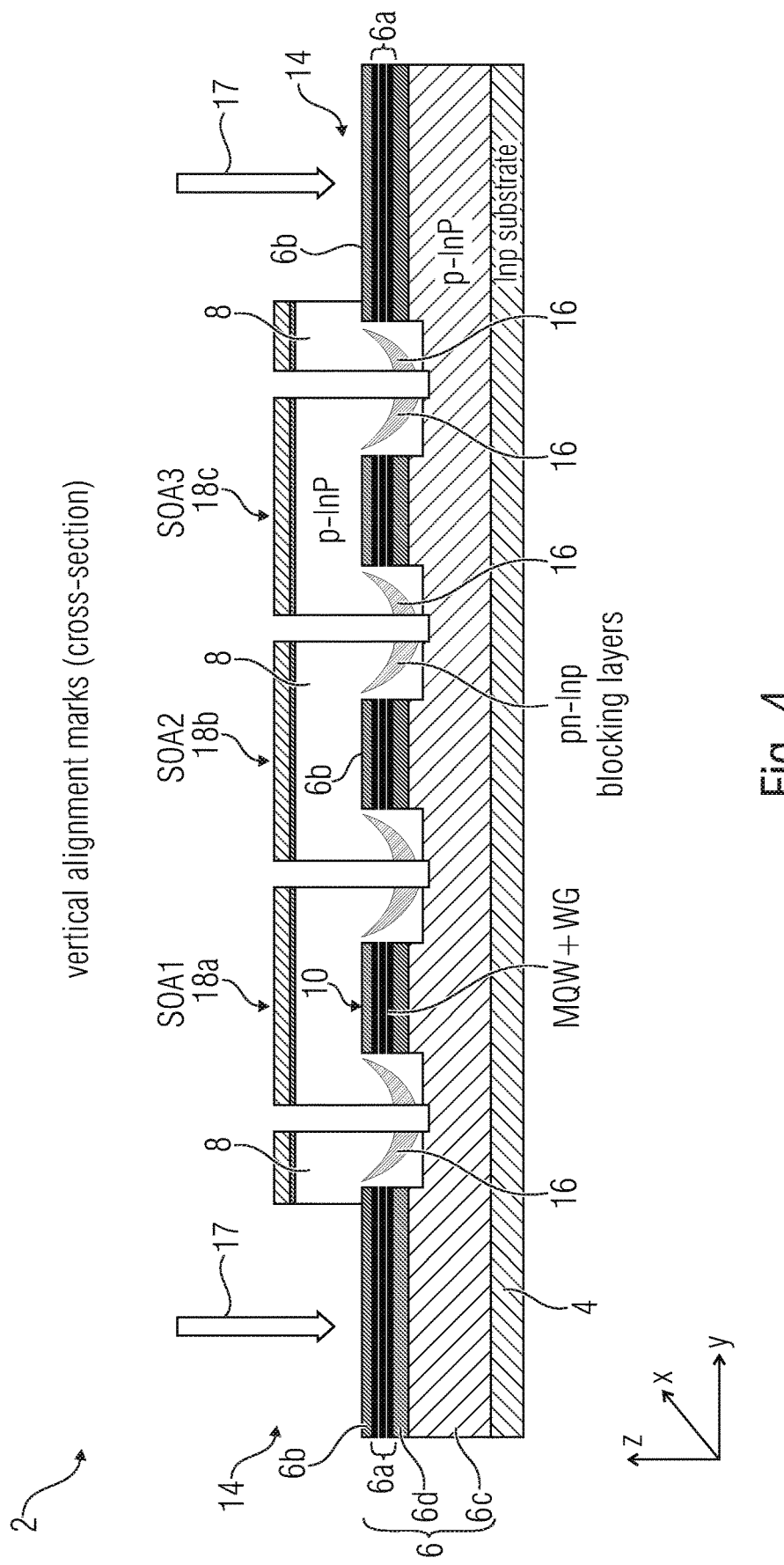
FIG. 4 shows a schematic cross-section of a semiconductor light source having vertical contact areas for an exemplary SOA array.

FIG. 4 shows a schematic illustration of a semiconductor light source in accordance with an embodiment which can be manufactured using the method 100. The semiconductor light source comprises the features described already in FIG. 2: the substrate 4, the layer sequence 6 comprising a light-emitting layer 6a and the boundary layer 6b, the cover layer 8 and the vertical alignment mark 14 in a region where the layer sequence 6 has been exposed from the cover layer 8. The layer sequence 6 may comprise further layers, like the n-doped indium phosphide layer 6c and a further light waveguide 6d below the light-emitting layer. Thus, the light-emitting layer may be embedded in the waveguide layers 6b and 6d. In other words, the waveguide layers 6b and 6d enclose the light-emitting layer 6a. The cover layer 8 may additionally comprise p-doped indium phosphide (p-InP) and overlying protective layers or contacts. In addition, in the cover layer, p-n junctions may be implemented which form the blocking layers 17 in order to prevent charge carriers from flowing past the light-emitting stripe which is also referred to as active zone. It is also to be mentioned that generally, instead of or in addition to the exemplarily mentioned indium phosphide (InP), different materials, like different III-IV semiconductors, like gallium arsenide (GaAs), for example, may be used in all regions of the semiconductor light source.

FIG. 4 shows a cross-section of the vertical alignment marks 14 which are generated by removing, like selectively (wet-chemically) etching, the cover layer 8 down to the boundary layer 6. In accordance with the embodiment shown in FIG. 4, the regions 18a, 18b and 18c form three optical semiconductor amplifiers (SOA1, SOA2 and SOA3) of an array of optical semiconductor amplifiers. The regions 18a, 18b and 18c each comprise at least one light-emitting stripe 10.

Figure 5:
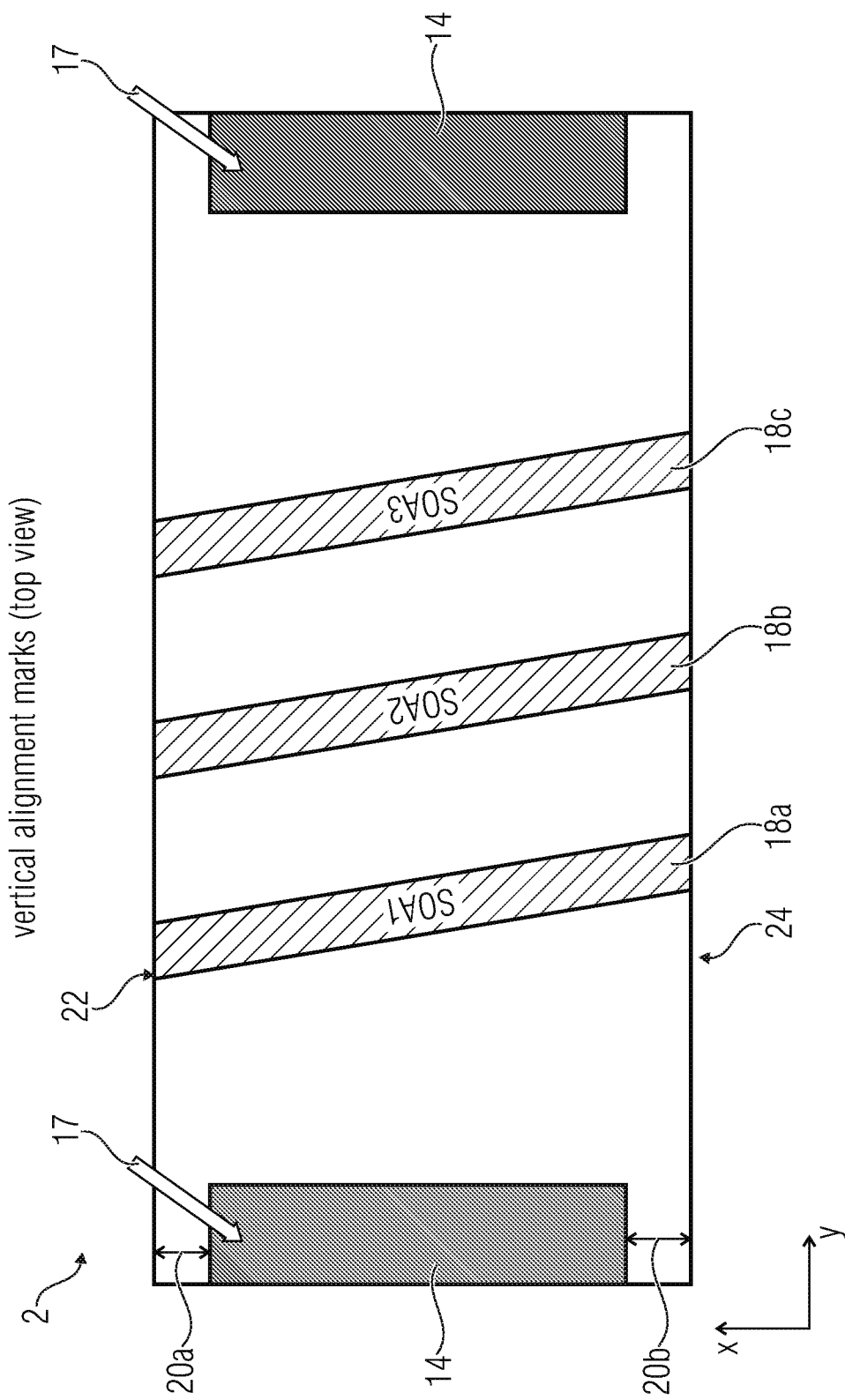
FIG. 5 shows a schematic top view of the semiconductor light source having vertical contact areas for an exemplarily SOA array, wherein covering these contact areas by facet coating material is prevented effectively by means of the installed step.

FIG. 5 shows a top view, corresponding to the cross-sectional view of FIG. 4, of the semiconductor light source in accordance with an embodiment. Additionally, FIG. 5 shows that the vertical alignment marks 14 are arranged to be spaced apart from the light-entrance and light-exit edges 22, 24 at a distance 20a, 20b. The arrows 17 which are illustrated already in FIG. 4, show the common vertical alignment marks, in top view and in cross section.

The light-entrance and light-exit edges 22, 24 refer to the entire edge of the semiconductor light source where the light enters the semiconductor light source and where the light exits from the semiconductor light source. Thus, step S106 can expose the alignment stripe to be spaced apart from a plane where the light-entrance edge or light-exit edge is positioned, as a vertical alignment mark. In other words, step S106 can expose the alignment stripe to be spaced apart from a facet of the light-emitting stripe, as a vertical alignment mark. The light-entrance edge and/or the light-exit edge or facet may be coated by a coating material. Coating the light-entrance edge or light-exit edge by the coating material may be performed after exposing the vertical alignment mark since, due to the spacing between the vertical alignment mark and the area to be coated, i.e. the light-entrance edge and/or the light-exit edge or facet, depositing the coating material on the vertical alignment mark is prevented. Thus, precise positioning of the vertical alignment marks can be maintained. The facet may be coated on the entire edge of the semiconductor light source (see FIG. 10a) or only in a limited region of the light-emitting stripe (see FIG. 10b). In addition, the vertical alignment mark may also be arranged to be spaced apart from the horizontal alignment mark.

The semiconductor light sources shown, like buried heterostructure SOA and laser arrays, differ considerably from the variations known so far.

Vertical contact areas 14 are etched in a precise manner by means of wet-chemical etching on the top-side waveguide 6a of the active laser layer. Corresponding areas are realized to the left and right of the laser stripes 10 of an array or, maybe, of a single laser stripe (cf. FIGS. 4 and 5).

In contrast to known variations, these areas are not to be realized in the corners of the chip, but only in the respective center of the chip.

By means of wet-chemical etching, etching may be performed selectively down to the top-side waveguide layer so that a vertical precision of a few nm can be achieved. By arranging these areas only in the center of the chip, unwanted covering of the areas when coating the facets (overspill) can be prevented effectively. Such a facet coating is used in all SOA and laser arrays. The layer thicknesses deposited are 0.5 . . . 2 µm so that a precise vertical alignment will no longer be possible.

Figure 6:
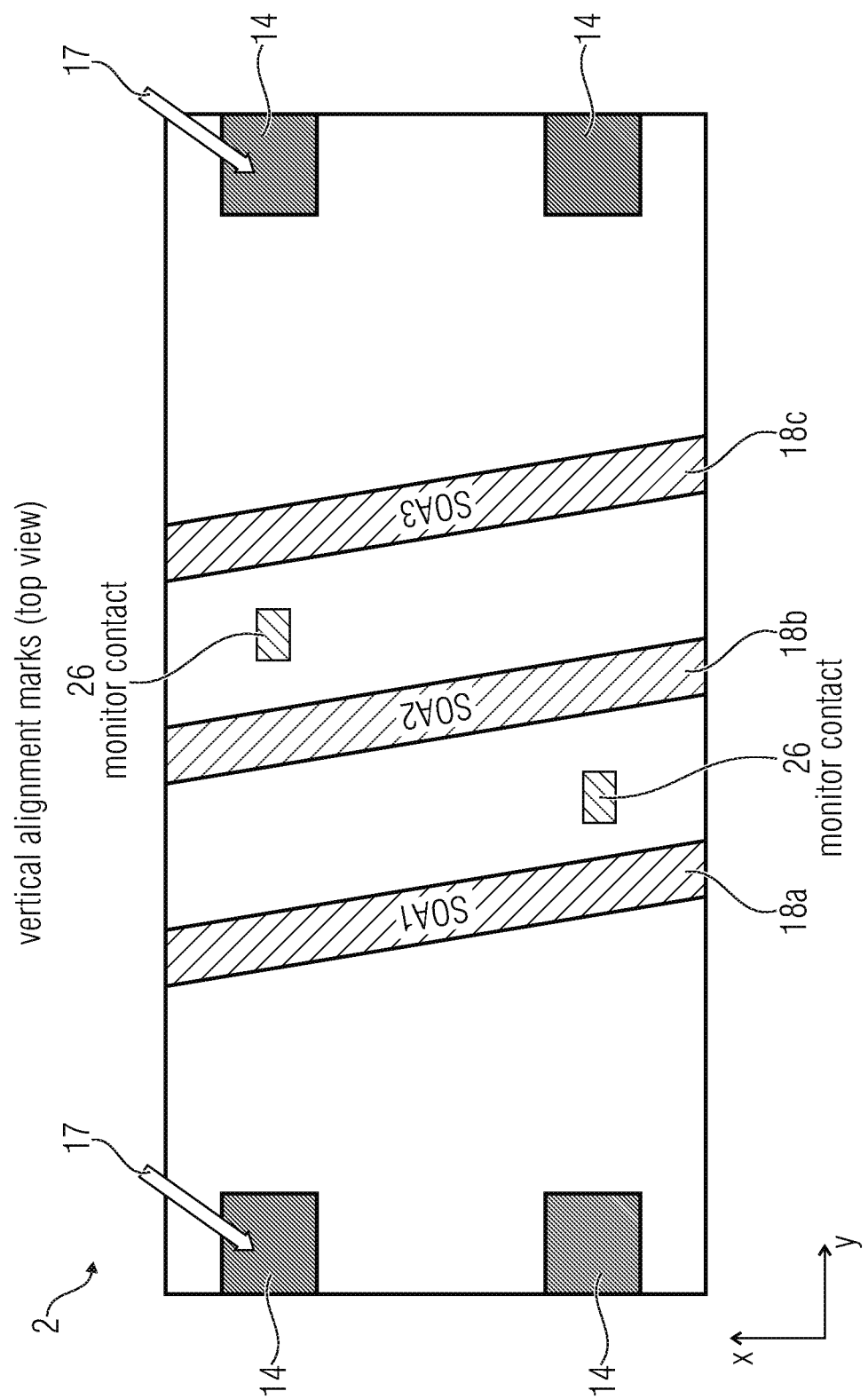
FIG. 6 shows a schematic top view of the semiconductor light source having vertical contact areas for an exemplarily SOA array, wherein the vertical contact areas here are separated into two different areas per side.

These vertical contact areas may, for example, also be separated into two separate contact areas each (FIG. 6).

FIG. 6 shows a top view of the semiconductor light source 2 in accordance with an embodiment, which differs from the embodiment of FIG. 5 in two features. One feature is the separation of the vertical alignment marks arranged laterally in FIG. 5, to form two alignment marks, for example, for each side. Further alignment marks, like in the form of parallel slots or a screen, are also possible.

In addition, FIG. 6 shows the arrangement of monitor contacts 26 on the top side of the semiconductor light source. As is illustrated, the monitor contacts may be arranged between the array structures of the individual light-emitting structures, but are not limited to these positions. When the semiconductor light source having the electrical alignment marks is inserted into the device which receives the semiconductor light source, a current flow can be generated by means of a corresponding contact on the device which contacts the exposed contact above the layer sequence, via another contact pair arranged at any position of the semiconductor light source and opposite the semiconductor device, the current flow allowing drawing conclusions as to correct alignment of the semiconductor light source. In other words, at least two exposed contacts on the semiconductor light source are of advantage here, wherein at least one of the two exposed contacts is arranged above the layer sequence and forms an electrical alignment mark. Thus, when the contacts on the semiconductor light source are not congruent to the respective contacts of the semiconductor device, higher a resistance is generated which, with a known voltage applied, results in a reduction of the current flow through the semiconductor light source and, consequently, is a measure of the quality of the positioning precision.

The vertical alignment usually is challenging for larger chip dimensions, since "smiling" effects, tilting etc., result in the Z position to coincidence with the target position only at selected points. In order to check the vertical position for each element of the array, it is suggested to supplement mechanical contacting by electrical contacting. In the case of a conductive substrate (like n-InP, for example), the current flow may, for example, be measured using an electrical contact at the contact point of the counterpart and the quality of mounting be checked on. An arrangement of such monitor contacts 26 may also be provided between the SOA/laser structures 10, 18a, 18b, 18c. This means that the monitor contacts represent a purely electrical method of active alignment and process control. This is not possible with methods known so far. A metallization layer having a thickness of only a few nm which ensures good electrical contact may, for example, be vapor-deposited.

Figure 7:
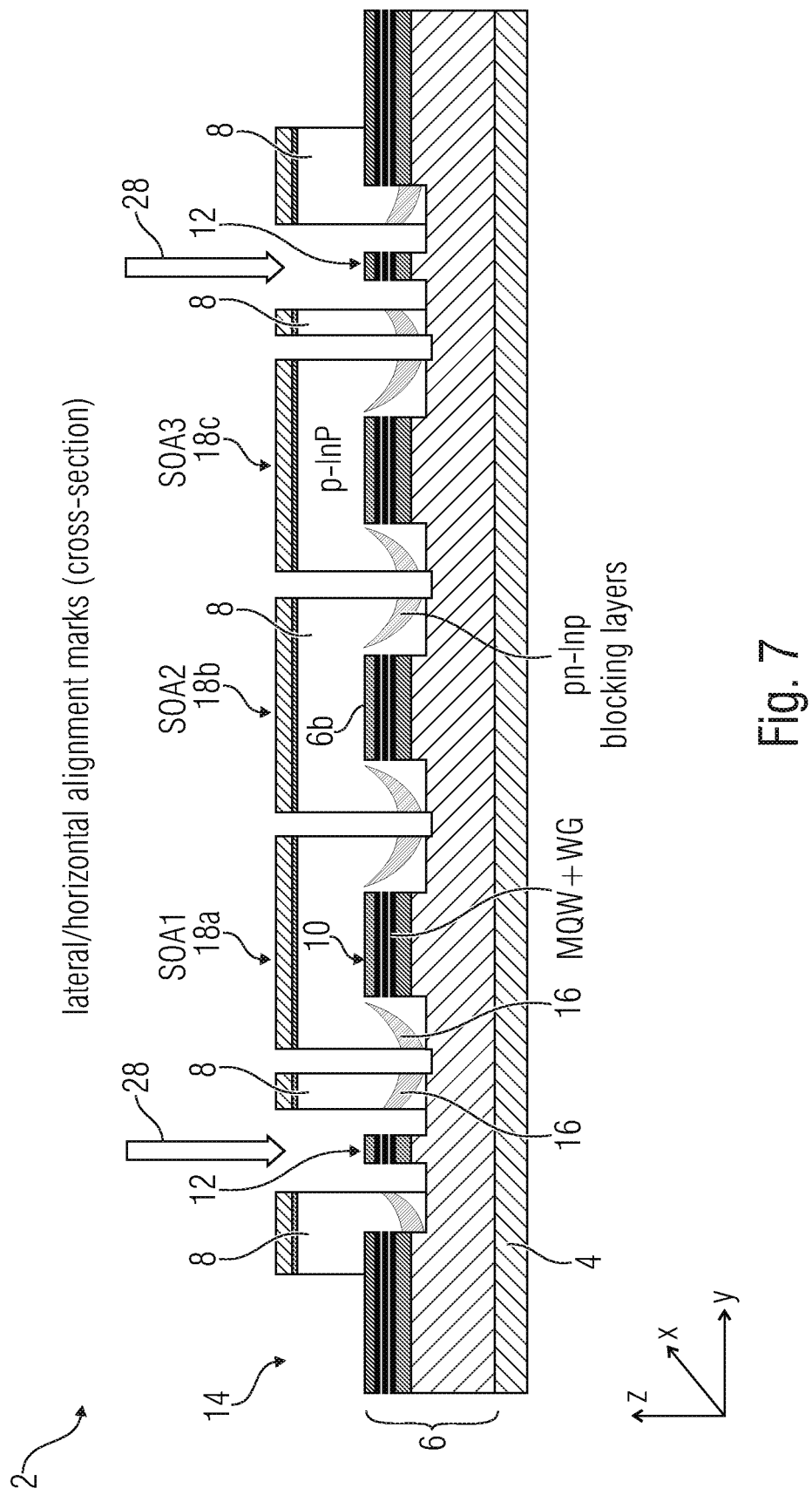
FIG. 7 shows a schematic top view of the semiconductor light source having horizontal alignment marks.
Figure 8:
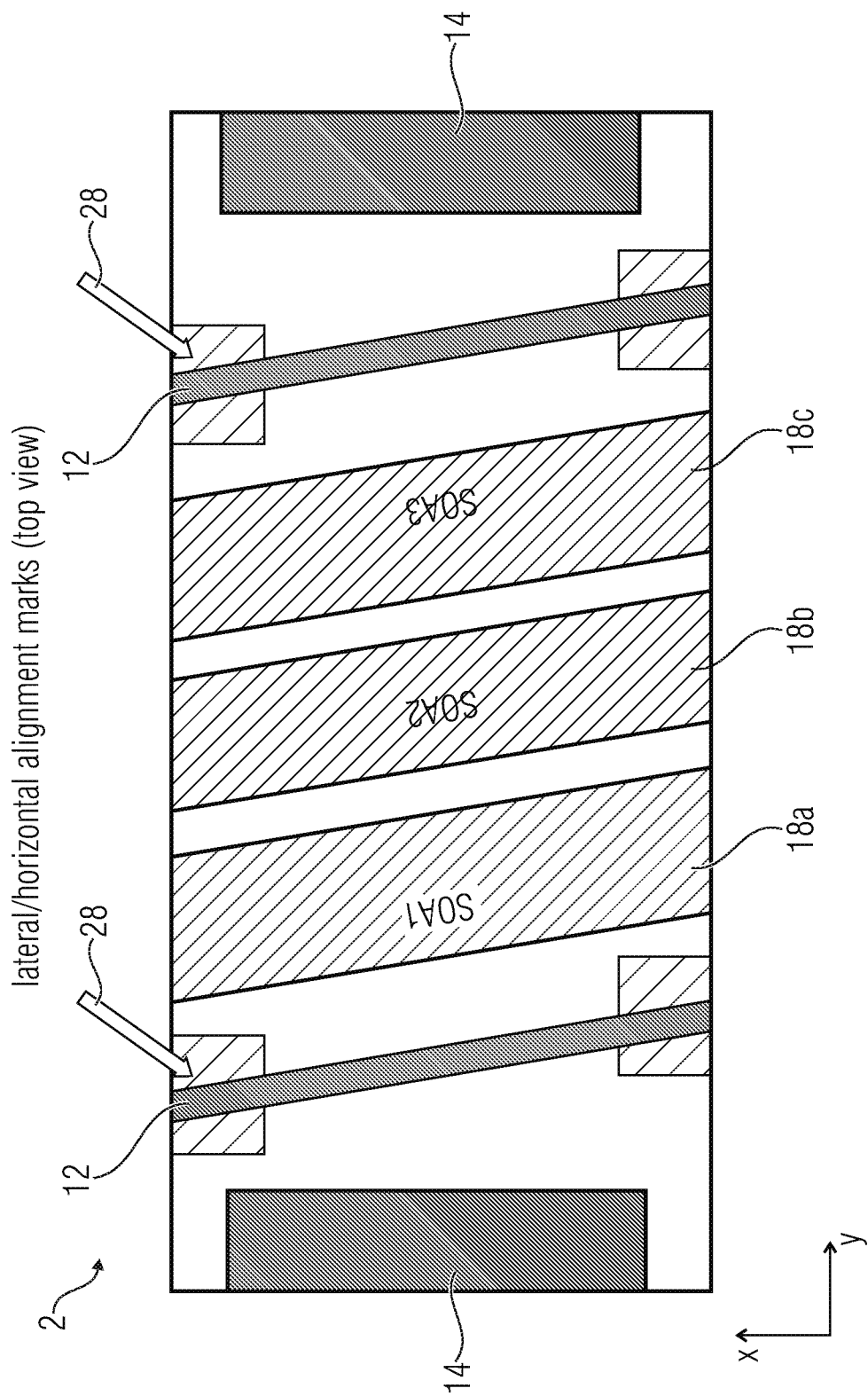
FIG. 8 shows a schematic top view of the semiconductor light source having horizontal alignment marks in accordance with an embodiment.

It is also to be mentioned that, in FIGS. 4 to 6, only lateral and electrical alignment marks were shown. FIG. 7 shows a schematic cross section of the semiconductor light source 2 in accordance with an embodiment which differs from the embodiment of FIG. 4 in the arrangement of horizontal alignment marks 12. FIG. 8 shows the semiconductor light source of FIG. 7 in a top view.

Precise horizontal alignment marks are used for XY alignment, which are manufactured in the same manufacturing step as are the laser stripes so that lithography imprecisions may be prevented on principle.

Additional stripes to the left and right are realized in parallel to the laser stripe. These stripes are exposed in a wet-chemical manner in one of the last process steps when manufacturing the laser and may then be used as alignment marks (visible from the top) (cf. FIGS. 7 and 8).

Another considerable advantage of these alignment marks is the fact that they may also be employed in the case of SOA and laser arrays divided at different positions in the longitudinal direction and each allow precise passive alignment in the sub-µm range.

Gap imprecisions, which cannot be avoided technologically, in the order of magnitude of +/−5 . . . 10 µm, can be neglected here since the corresponding alignment marks are affected by this as well. The precise position of the laser exit facets in this case is defined precisely, which ensures precise alignment. This applies for both facets.

In addition, it is of advantage that these lateral alignment marks and, thus, the precise position of the active layer cannot only be acquired in the top view, but also in the facet view. This has not been possible using alignment marks known so far and allows three-dimensional information acquisition.

The additional chip area consumed for the alignment marks can be neglected in SOA or laser arrays so that the manufacturing costs of these chips do not change or, at least, not essentially.

Figure 9:
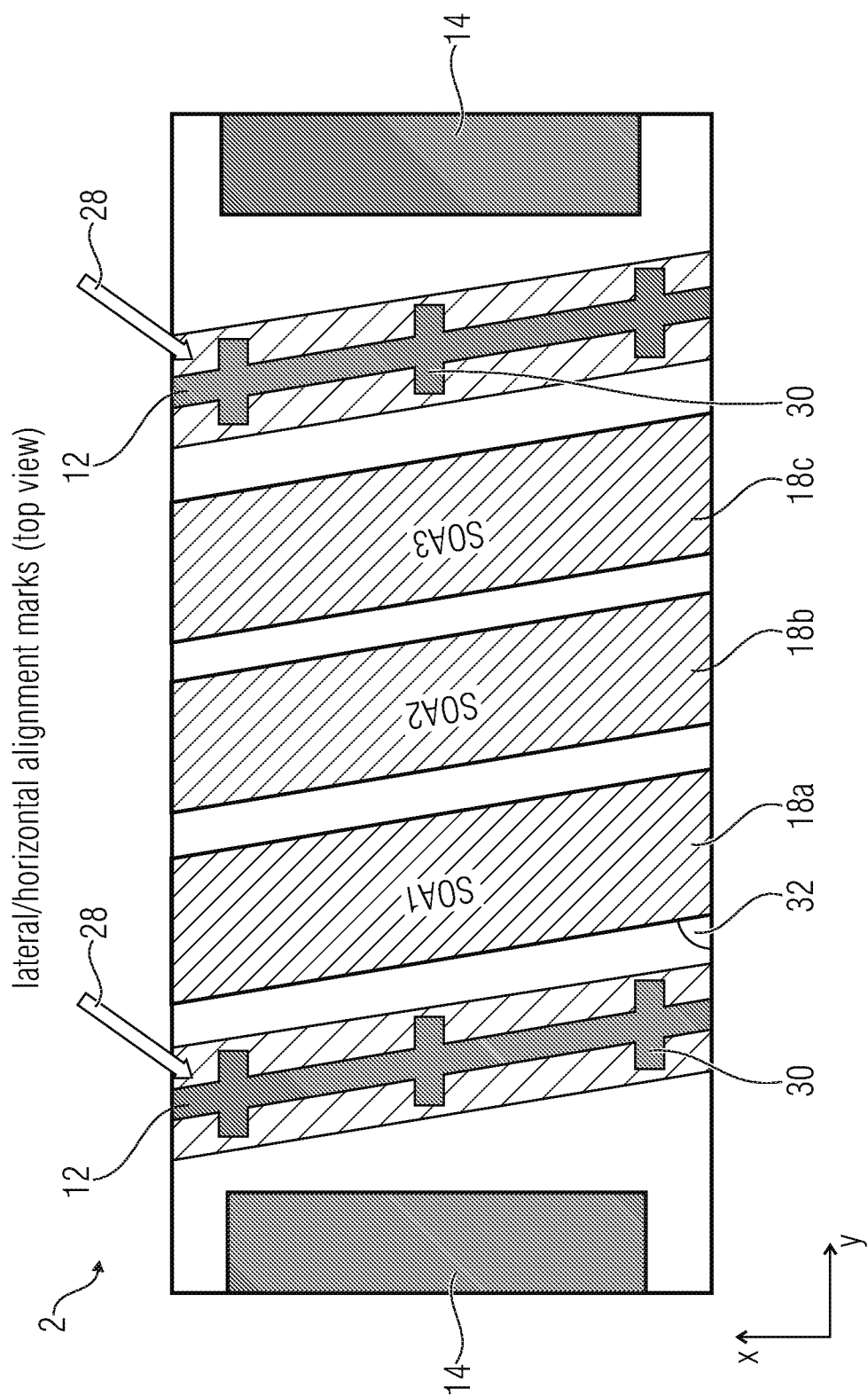
FIG. 9 shows a schematic top view of the semiconductor light source having horizontal alignment marks in accordance with another embodiment.

FIG. 9 shows the embodiment of FIG. 8 comprising further alignment marks 30 allowing alignment of the semiconductor light source along the alignment stripe 12. The further alignment marks 30 may, as is illustrated in FIG. 9, be connected mechanically to the alignment stripes 12, thereby consuming a comparatively small amount of space. In addition, the further alignment marks 30 may also be arranged in another region of the semiconductor light source apart from the alignment stripes. Since the alignment stripes 12 or horizontal alignment marks and the further alignment marks 30 are etched down to the waveguide, i.e. the boundary layer 6a, and consequently comprise the same height as the vertical alignment marks 14, they may also be used as further vertical alignment marks. In other words, vertical contact areas 12 may also be realized along the entire structure and may contain additional structures 30 for orientation in the X direction (see FIG. 9).

Figure 10A:
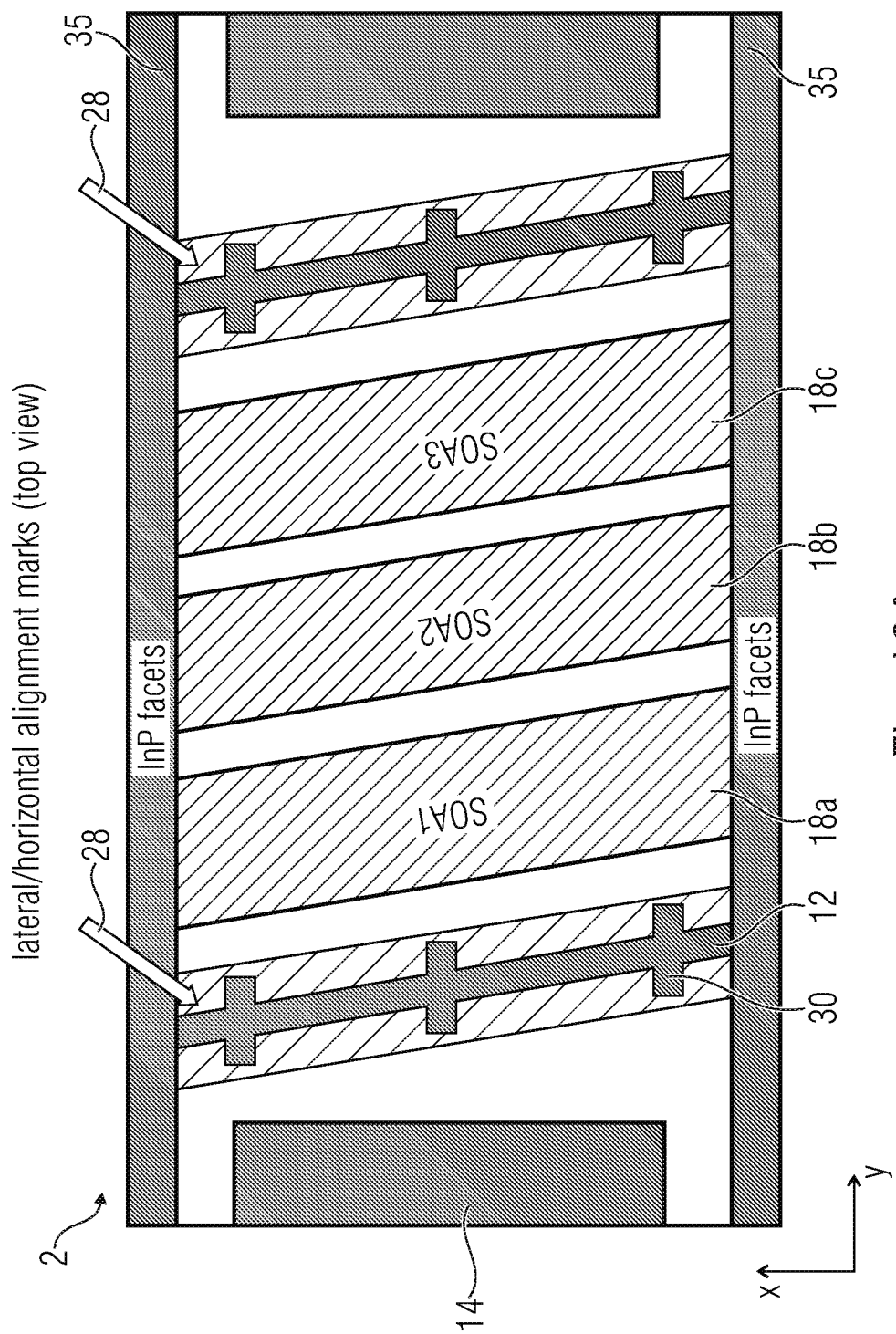
Figure 10B:
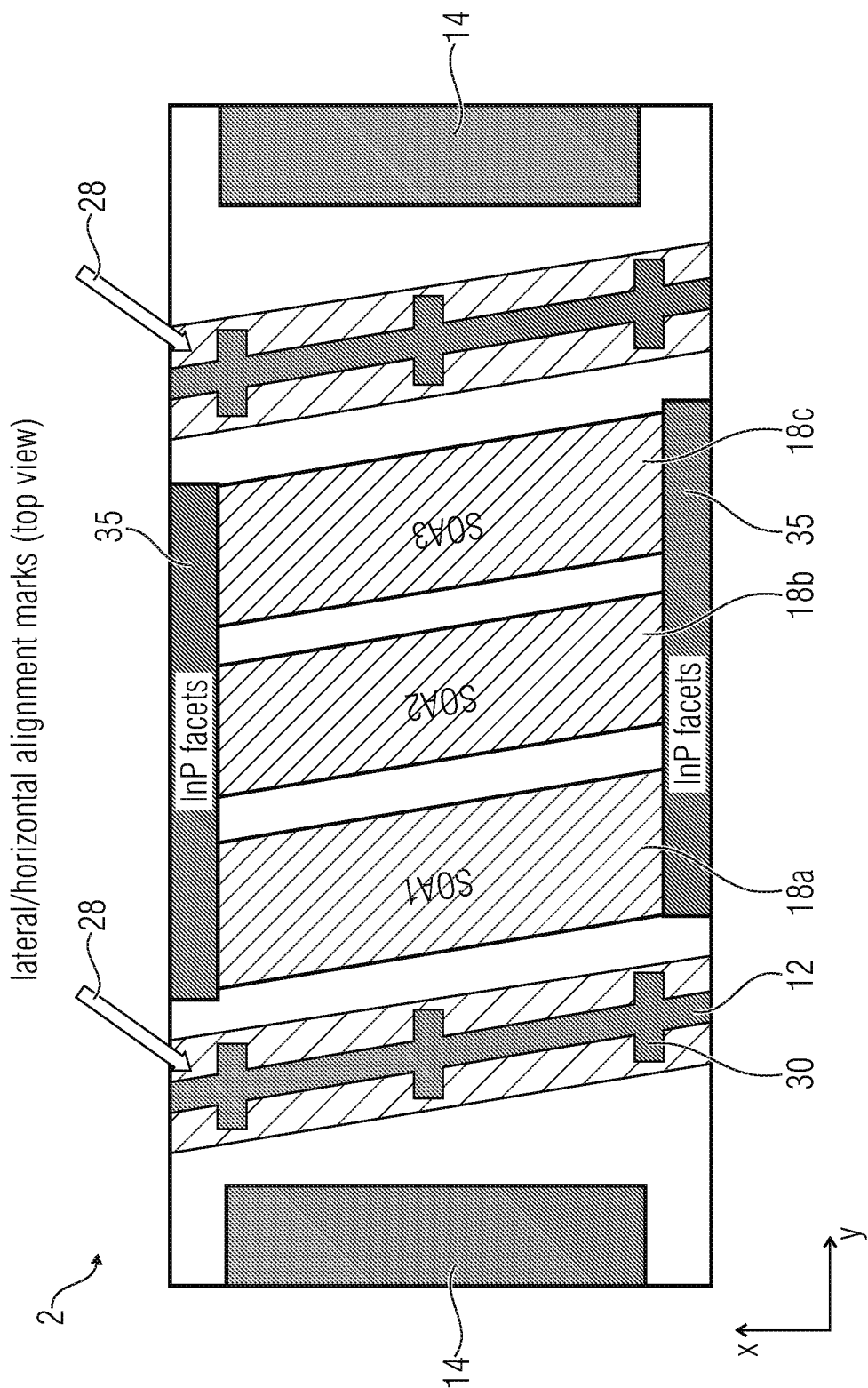

These vertical contact areas on the horizontal alignment marks 12, 30 may also be employed for SOA or laser arrays comprising InP facets (with no active layer in the facet region), wherein FIGS. 10a and 10b show two possible embodiments. FIG. 10A and FIG. 10B both show the embodiment of the semiconductor light source of FIG. 9 comprising InP facets at the light-entrance and light-exit edges. In FIG. 10A, the InP facet 35 extends over an entire width of the semiconductor light source, whereas, in FIG. 10B, the InP facet 35 is restricted to the region of the active layers, i.e. the light-emitting stripes.

Figure 11:
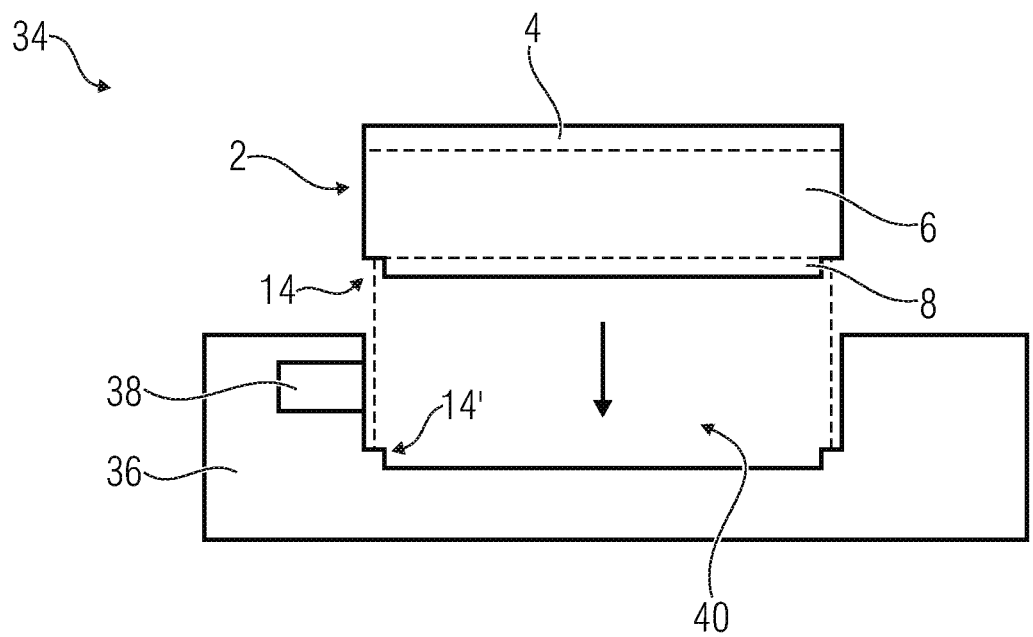
FIG. 11 shows a schematic cross-section of a semiconductor device comprising a substrate having a semiconductor light source inserted therein.
Figure 12:
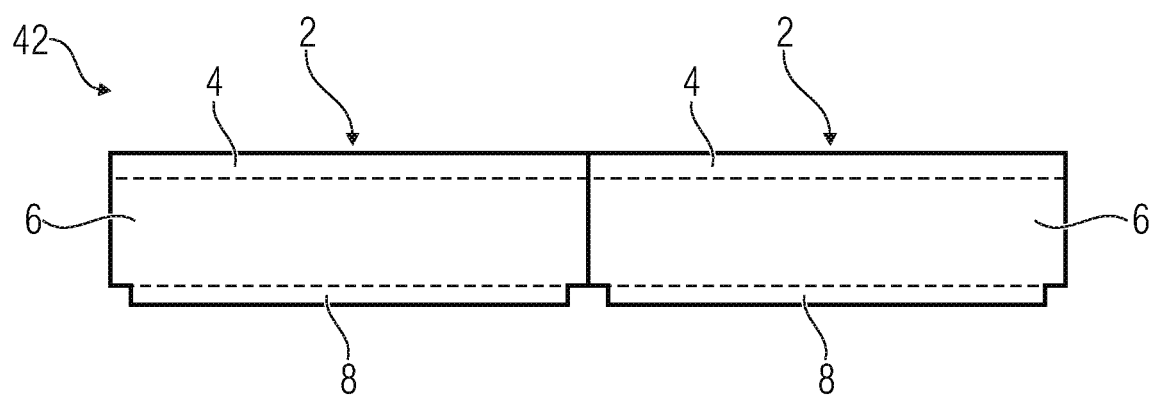
FIG. 12 is a schematic illustration of a cascade of semiconductor light sources.

FIG. 11 shows a semiconductor device 34 comprising a substrate 36 and an optical unit 38, wherein the substrate 36 comprises a recess 40 configured to receive the semiconductor light source 2 or a cascade of semiconductor light sources, shown in FIG. 12, such that the semiconductor light source 2 is aligned with/relative to the optical unit 38. The optical unit may, for example, be a waveguide patterned in silicon or another (semiconductor) material, or an optical device. In the embodiment shown in FIG. 11, the semiconductor light source 2 may be a laser or an LED since only one optical unit 38 is provided for receiving the light emitted. If the semiconductor light source 2 is an optical semiconductor amplifier (SOA), it is of advantage to arrange a further optical unit opposite the optical unit 38 in order to couple light into the optical semiconductor amplifier which is amplified therein and coupled out at the optical unit 38.

FIG. 12 shows a schematic illustration of a cross section of a cascade of semiconductor light sources. It comprises a plurality of, in this case two, semiconductor light sources. The light of a laser emitted may, for example, be coupled directly into one or several optical semiconductor amplifier connected in series or one behind the other in order to amplify the output signal of the laser. Here, the light-exit edge of a semiconductor light source is coupled to the light-entrance edge of a subsequent semiconductor light source.

Further embodiments of the invention relate to the following examples:
1) etched facets may be used instead of InP facets
2) RSOA arrays, DFB arrays, DBR arrays or HCSEL arrays may be used instead of SOA arrays
3) combinations of SOAs and DFB lasers to form arrays are possible
4) DFB-SOA arrangements in a longitudinal direction are possible
5) variations having an active or passive taper integrated on one side or both sides are possible
6) variations having electrical contacts separated in the longitudinal direction are possible
7) variations having a top-side p and n contact for the individual DFB lasers or SOAs are possible
8) if used, additional vertical contact areas and horizontal alignment marks can be mounted in the center of the array
9) single chips having such vertical contact areas and horizontal alignment marks can also be manufactured
10) ridge-waveguide-based SOA or laser arrays may also be used Although some aspects have been described in connection with a device, it is understood that these aspects also represent a description of the corresponding method so that a block or element of a device is to be understood to be also a corresponding method step or feature of a method step. In analogy, aspects having been described in connection with or as a method step also represent a description of a corresponding block or detail or feature of a corresponding device.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A method for manufacturing a semiconductor light source comprising a substrate, a layer sequence arranged above the substrate comprising a light-emitting layer and an upper boundary layer arranged above the light-emitting layer, a horizontal alignment mark and vertical alignment marks, comprising:
   patterning the layer sequence in order to form a light-emitting stripe for defining the semiconductor light source and an alignment stripe extending in parallel thereto at the same time;
   applying a cover layer on the patterned layer sequence;
   removing a first part of the cover layer in order to expose the alignment stripe as the horizontal alignment mark, and second parts of the cover layer in order to expose, on both sides of the light-emitting stripe, regions of the layer sequence spaced apart from a light-entrance edge or a light-exit edge of the semiconductor light source, as vertical alignment marks, at the same time.

2. The method in accordance with claim 1, comprising coating the light-entrance edge or the light-exit edge by a coating material after exposing the vertical alignment marks.

3. The method in accordance with claim 1, wherein removing the part of the cover layer exposes the boundary layer.

4. The method in accordance with claim 1, wherein removing the part of the cover layer comprises a selective etching process down to the boundary layer.

5. The method in accordance with claim 1, wherein removing the part of the cover layer comprises wet-chemical etching.

6. The method in accordance with claim 1, comprising arranging an exposed contact above the layer sequence, wherein the contact forms an electrical alignment mark.

7. The method in accordance with claim 6, comprising applying a metallization layer on the contact in order to allow improved electrical contacting of the contact.

8. The method in accordance with claim 1, wherein patterning the layer sequence to form the alignment stripes comprises forming a further alignment mark, the further alignment mark allowing alignment of the semiconductor light source along the alignment stripe.

9. The method in accordance with claim 1, comprising etching the light-entrance or light-exit edge or applying an indium phosphide layer on the light-entrance or light-exit edge in order to form a planar facet.

10. The method in accordance with claim 1, comprising forming an array of semiconductor optical amplifiers (SOAs or reflective optical amplifiers, RSOAs), distributed feedback lasers (DFBs), passive grating lasers (distributed Bragg reflector lasers, DBRs), DFB lasers comprising an integrated mirror so that there will be emission in the vertical direction (horizontal-cavity surface-emitting lasers, HCSELs) or corresponding single lasers in order to form the semiconductor light source.

11. The method in accordance with claim 1, wherein patterning the light-emitting stripe and the alignment stripe forms the same in an angle greater or smaller than 90° relative to the light-entrance or light-exit edge.

12. The method in accordance with claim 1, comprising arranging an active or passive taper at the light-entrance or light-exit edge.

13. The method in accordance with claim 1, comprising forming an exposed p and/or an exposed n contact above the layer stack in order to contact the light-emitting stripe electrically.

14. The method in accordance with claim 1, wherein patterning forms a further light-emitting stripe arranged in parallel to the light-emitting stripe and spatially separated therefrom.

15. The method in accordance with claim 14, comprising arranging further vertical alignment marks or horizontal alignment marks between the light-emitting stripe and the further light-emitting stripe.

16. A semiconductor light source comprising:
a substrate, a patterned layer sequence arranged above the substrate comprising a light-emitting layer and an upper boundary layer arranged above the light-emitting layer, a horizontal alignment mark and vertical alignment marks,
wherein the patterned layer sequence comprises a light-emitting stripe which defines the semiconductor light source, and an alignment stripe extending in parallel thereto;
a cover layer on the patterned layer sequence;
wherein the cover layer is open over a first part of the patterned layer sequence so that the alignment stripe as a horizontal alignment mark is exposed, and
wherein the cover layer is open over second parts of the patterned layer sequence so that, on both sides of the light-emitting stripe, regions of the layer sequence arranged to be spaced apart from a light-entrance edge or a light-exit edge of the semiconductor light source, are exposed as vertical alignment marks.

17. A cascade of semiconductor light sources comprising a plurality of semiconductor light sources in accordance with claim 16, wherein the light-exit edge of a semiconductor light source is coupled to the light-entrance edge of a subsequent semiconductor light source.

18. The cascade in accordance with claim 17, wherein a semiconductor laser forms a first semiconductor light source of the cascade and at least one further semiconductor amplifier forms a further semiconductor light source of the cascade.

19. A semiconductor device comprising:
a semiconductor light source in accordance with claim 16 or a cascade of semiconductor light sources comprising a plurality of semiconductor light sources in accordance with claim 16, wherein the light-exit edge of a semiconductor light source is coupled to the light-entrance edge of a subsequent semiconductor light source,
a substrate, and
an optical unit,
the substrate comprising a recess configured to receive the semiconductor light source or the cascade of semiconductor light sources such that the semiconductor light source is aligned with the optical unit.

* * * * *